(12) United States Patent
Coronel et al.

(10) Patent No.: US 6,353,264 B1
(45) Date of Patent: Mar. 5, 2002

(54) PSEUDOMONOLITHIC WAFER SCALE MODULE

(75) Inventors: Ramon Coronel, Torrance; Karen A. Fucik, Redondo Beach; Peter S. Yoon; David W. Y. Lee, both of Torrance; Richard B. Sherwood, Palos Verdes Estates; Donald G. Heflinger, Torrance, all of CA (US)

(73) Assignee: TRW Inc., Redondo Beach, CA (US)

( * ) Notice: Subject to any disclaimer, the term of this patent is extended or adjusted under 35 U.S.C. 154(b) by 23 days.

(21) Appl. No.: 09/618,771

(22) Filed: Jul. 18, 2000

(51) Int. Cl.[7] .................. H01L 23/48; H01L 23/52; H01L 29/40
(52) U.S. Cl. .............. 257/777; 257/432; 257/686; 385/92; 385/49
(58) Field of Search ................. 257/431, 432, 257/433, 664, 686, 685, 723, 724, 777; 385/89, 92, 49; 361/790, 803, 804, 742; 439/69, 74

(56) References Cited

U.S. PATENT DOCUMENTS 3,761,858 A * 9/1973 Oka ........................ 338/48
5,568,356 A * 10/1996 Schwartz ................ 361/679
5,726,786 A * 3/1998 Heflinger ................ 359/152
5,933,608 A * 8/1999 Osmon .................... 709/243
6,090,636 A * 7/2000 Geusic et al. ............ 438/31
6,261,853 B1 * 7/2001 Howell et al. ............ 438/14

FOREIGN PATENT DOCUMENTS

JP 07056036 A * 3/1995

* cited by examiner

Primary Examiner—Eddie Lee
Assistant Examiner—Chris Chin Chu (57) ABSTRACT

A wafer-scale module includes a plurality of stacked wafers, each having a thin semiconductor layer disposed on a surface of the wafer, a plurality of wafer-scale integrated (WSI) circuits formed on the semiconductor layer and a plurality of nodes formed on the semiconductor layer. Each node provides an optoelectronic interface to an axial optical waveguide for high-speed optical interconnectivity between the WSI circuits and other integrated wafer circuit devices of the stack. A top plate is included and is disposed on the plurality of stacked wafer devices. A base plate, included for purposes of thermal dissipation, is disposed opposite the top plate such that the plurality of stacked wafers are sandwiched between the top plate and the base plate and all are assembled.

32 Claims, 9 Drawing Sheets

PSEUDOMONOLITHIC WAFER SCALE MODULE

CROSS REFERENCES

This invention is related to patent applications Ser. No. 09/123,136, filed Jul. 27, 1998, entitled "Solid-State Spacecraft With Minimal Moving Parts" by inventors H. Eller and R. Coronel, Ser. No. 09/336,019, filed Jun. 18, 1999, entitled "Broadcast Optical Communication System Employing Waveguide Having Grating Normal To Sources And Detectors" by inventor D. Heflinger and patent application, filed simultaneously with present invention, entitled "Large Multi-Function Integrated Circuit Device" by inventors R. Coronel et al., all of which are assigned to the same assignee as the present invention, and the disclosures of which are incorporated herein.

BACKGROUND OF THE INVENTION

1. Field of the Invention

The present invention relates generally to semiconductor devices and, more specifically to a semiconductor device module that includes a plurality of integrated circuit devices formed by wafer-scale integration and oriented in a stacked configuration upon a heat dissipating base plate; and high-speed axial optical interconnects used to provide interconnections between the integrated circuit devices located at each stack level.

2. Description of the Prior Art

Conventionally, the manufacture of integrated circuits is accomplished by simultaneously fabricating a plurality of identical circuits on a single wafer. The wafer is later scribed into a plurality of chips that are separately packaged and later integrated into a larger system. For example, spacecraft avionics systems are large integrated systems having circuits built from conventional electronic chips and components. The chips are produced and packaged by many different manufacturers and because the packaged chips are substantially larger than the chips themselves, the circuits are typically much larger than is necessary to perform each circuit's intended function. These packaged chips may be placed into several spacecraft avionics units (black boxes) where each unit contains a specific function required for the given spacecraft system. More specifically, integrated circuits (ICs) on wafer board assemblies are enclosed inside black boxes where the circuitry contained within a particular black box communicates with other black boxes through limited bandwidth copper wires or optical fibers. As a result, connections between the black boxes are lossy and the number of spacecraft avionics units required for a particular system is typically large. The quantity, size, and interconnections required for such units necessitates spreading the units over a large physical area, thereby, preventing satellites or similar spacecraft from being compact and lightweight structures.

Wafer-scale integration has been described in the art as a method for alleviating individual chip packaging and integration by including all of the processing required for a particular function in a single integrated circuit formed on a single semi-conductor wafer. It has further been described as a means for meeting the demands of high-speed processing since, by including all of the processing means of a particular application in a single integrated circuit, short and high-speed interconnections may be formed. However, wafer-scale integration is not without its disadvantages, since defects due to the presence of impurities in the semiconductor crystal structure can occur and such defects can prevent individual circuit components located on the area of the defect from functioning properly. The larger the surface area of the wafer, the greater the number of defects; therefore, the ability to increase the wafer size to accommodate larger and larger systems is obviated in the absence of a defect-free wafer.

Various means of detecting and bypassing wafer defects have been utilized to mitigate the effects that such defects have on wafer-scale integrated circuits. Generally, the operative circuits or devices on a wafer are electrically isolated from the inoperative devices through the use of discretionary connections. For example, U.S. Pat. No. 5,514,884 discloses a method of using multiple identical blocks of addressable circuitry that are tested prior to interconnection to compensate for the defects in a wafer-size integrated circuit. The multiple identical blocks of circuit elements and multiple identical blocks of control logic are provided on a wafer where both the blocks of circuit elements and the blocks of control logic are small enough that blocks found to be defective can be discarded without significantly reducing the size of the device. U.S. Pat. No. 5,274,264 discloses a defect tolerant power distribution network for wafer-scale integrated circuits, and a method for detecting and removing short circuits from the network. Portions of the conductive lines in the power distribution network are fabricated with an area whose width is reduced relative to the remainder of the line. The amount of reduction in the line is sufficient to produce a hot spot in response to current flow to a short circuit that is located at an electrically downstream location on the line. Upon locating the hot spot as being associated with a specific circuit, the shorted circuit is removed from the remainder of the network by such means as laser cutting. U.S. Pat. Nos. 5,498,886 and 5,576,554 disclose forming a plurality of circuit modules on a wafer and grouping the modules into blocks arranged on a rectangular grid. An interconnect network including signal lines and power lines, each with built-in redundancy, surrounds each block. Each module and each segment of the interconnect network are tested and, by using fusible links, the defect-free segments of the interconnect network are connected to the functional circuit modules. U.S. Pat. No. 5,430,734 discloses an integrated circuit device that includes a wafer containing dynamically configurable gate arrays. The device provides a fault-tolerant design that addresses manufacturing defects by mapping all defective gate arrays and defective portions of each gate array on the wafer. Such defect mapping occurs during initial wafer testing following the wafer fabrication and the mapping information is later used to program the desired wafer functions to exclude defective portions of the wafer. U.S. Pat. No. 5,140,189 discloses creating externally formed connections to a wafer-scale semiconductor device to avoid wafer level defects located at various sites on the wafer. In particular, small external shorting blocks or patch circuits are utilized to define spare sites that may be used as replacement sites for defective primary sites. The patch circuit is used in combination with a decoder circuit that is coupled to a predetermined number of spare sites on a fully processed wafer-scale integrated (WSI) wafer. The decoder contains one enabling output for each spare site so that connections completed by the shorting block or patch circuit can assign a logical address for a defective primary site to a designated spare site. Control circuits also exist in the wafer to electrically remove one or more defective primary sites and to activate a required number of spare sites that operate as replacement sites for the defective primary sites. U.S. Pat. No. 5,084,838 discloses a plurality of integrated circuits mounted on a large-scale integrated circuit device that are each provided with a bypass circuit that selectively shorts input and output nodes in the corresponding unit integrated circuit. By selectively bringing the bypass circuit into a transfer state, all unit integrated circuits that are judged to be normal among a plurality of unit integrated circuits disposed along one row are coupled together.

To avoid testing individual circuits and manually connecting circuits to bypass defective circuit components, U.S. Pat. No. 5,287,345 discloses an array of interconnected node units formed as an integrated circuit on a semiconductor wafer for use in data handling, data processing or data storage. Each node unit includes a controlled switch for routing signal packets to destination node units whose addresses are included in the packets and also includes an automatic self-test function that, following satisfactory completion of the self-test, transmits a signal to adjacent node units that it is functioning properly. The controller of a node unit switch stores datum concerning which adjacent node units are defective and directs signal packets on paths around the defective node units.

Notwithstanding that wafer defect avoidance techniques, like those previously described, may be necessary to produce operative wafer-scale integrated circuits, such techniques may not, by themselves, be acceptable for wafer-scale integration that meets the demands of applications requiring increased processing speed and performance, as well as increased integration density of microelectronic components. Such applications, for example in avionics systems and other similarly larger and complex systems, could potentially require considerably large wafers. And, as previously described, increases in wafer size (or wafer surface area) are accompanied by proportional increases in the number of wafer defects. The more redundancy one employs to overcome wafer defects and increase yield, the more system performance is sacrificed. As a result, practical limitations on the wafer size and the circuit density may be necessary to avoid sacrificing system performance.

However, one method that has been described in the art for creating higher density circuits includes interconnecting individual integrated circuit wafers in a stacked wafer structure. Several approaches have been used to interconnect the wafers in the stack. In some approaches, the wafers in the stack are electrically interconnected using solid vertical columns of metallic conductive feed-throughs, such as copper. However, the use of solid feed-throughs to interconnect wafers may cause damage to the stacked wafer structure because of incompatible coefficients of thermal expansion between the feed-through materials and the integrated circuit wafer materials. Other approaches, like the approach disclosed in U.S. Pat. No. 5,229,647, provide each wafer in the stack with through holes that expose bonding pads on the wafers. The bonding pads of the wafers in the stack are then electrically connected by either filling the through holes with electrically conductive liquid bumps, or inserting some suitable electrically conductive material into the through holes to provide a continuous vertical electrical connection between the wafers. A disadvantage of such approaches includes the need for special tooling to create the electrically conductive bumps at predetermined uniform heights. Still other approaches, for example U.S. Pat. No. 5,661,087, include providing electrical interconnections to points along the periphery of stacked wafer segments. These approaches are subject to disadvantages similar to those observed in the bonding pad approaches described above, namely, they require a special dispensing mechanism to dispense the conductive traces (e.g. silver-filled epoxy) along the periphery of the wafer segments. Moreover, the problem with the stacked wafer approaches discussed above and similar approaches is the wafers in the stack are electrically interconnected. Because of recent advances in semiconductor device fabrication and high-speed processing requirements, an integrated optics approach to signal transmission and processing offers significant advantages both in performance and cost when compared to conventional electrical methods.

What is needed, therefore, is a semiconductor device module that includes a plurality of stacked integrated circuit devices formed by wafer-scale integration, with high-speed axial optical interconnects used to provide interconnections between the integrated circuit devices located at each stack level thereby enabling the functions of large-scale systems to be distributed among multiple such wafer-scale devices with a result that is physically equivalent to all of the system circuitry being monolithically integrated on one very large wafer. Moreover, since using WSI technology alone is not sufficient to accomplish a spacecraft system, or a similarly large and complex system, due to heat dissipation requirements (usually greater than 7,000 Watts), the semiconductor device module of the present invention provides the capability to dissipate significant amounts of heat in a very compact area.

SUMMARY OF THE INVENTION

The preceding and other shortcomings of the prior art are addressed and overcome by the present invention that provides a wafer-scale module. The module includes a plurality of wafers, each having a semiconductor layer formed thereon, a plurality of through holes arranged circumferentially thereon and extending normal to a plane thereof, a plurality of optical transmission interfaces extending normal to the wafer plane, and a plurality of integrated circuits formed on the semiconductor wafer. The plurality of integrated circuits include a plurality of nodes, each node being coplanar with the wafer and proximate to one optical transmission interface. Each node also has the capability for transmitting and receiving optical data to and from the plurality of integrated circuits. The module also includes a plurality of optical waveguides, each extending normal to a plane of each wafer located in the stack and axially through one respective optical transmission interface at each wafer level in the stack. A top plate is disposed on the plurality of stacked wafers and includes a plurality of through holes arranged circumferentially thereon extending normal to a plane of the wafer. Each top plate through hole has corresponding alignment to one wafer through hole. A base plate is disposed opposite the top plate such that the plurality of stacked wafers are sandwiched between the top plate and the base plate. The base plate provides thermal dissipation for the module and also includes a plurality of through holes arranged circumferentially thereon and extending normal to a plane thereof. Each base plate through hole having corresponding alignment to one top plate through hole and one wafer through hole so that the module can be fastened together via the base plate, top plate and stacked wafer through holes.

BRIEF DESCRIPTION OF THE DRAWINGS

Reference is now made to the following description and attached drawings, wherein.

DETAILED DESCRIPTION OF THE INVENTION

The application of wafer scale integration (WSI) technology in spacecraft and similar complex large-scale systems has staggering size, weight and system benefits over any other single technological advancement. Even so, state of the art packaging with higher levels of integration remains orders of magnitude shy of the benefits that WSI technology affords. For example, today's capabilities with multi-million gate application specific integrated circuits (ASICs) still require attachment of discrete packages or multi-chip modules (MCMs) to printed wafer boards (PWBs) within the "black boxes" of spacecraft systems.

The present invention overcomes the paradigm of integrated circuits (ICs) on circuit board assemblies that are enclosed inside black boxes where the circuitry contained within a particular black box communicates with other black boxes through limited bandwidth copper wires or optical fibers, resulting in lossy connections. Instead, the present invention discloses a novel implementation of WSI electronics to overcome the mechanical and electrical overhead (IC package, signal buffers, line amplifiers, PWB, chassis enclosure, cables, connectors, etc.) presently required to communicate from one black box to another in a spacecraft or similar system while providing the capability to dissipate significant amounts of heat, for example, greater than 7000 Watts, in a very compact and large bandwidth (multi-gigabit/second) environment.

Figure 1:
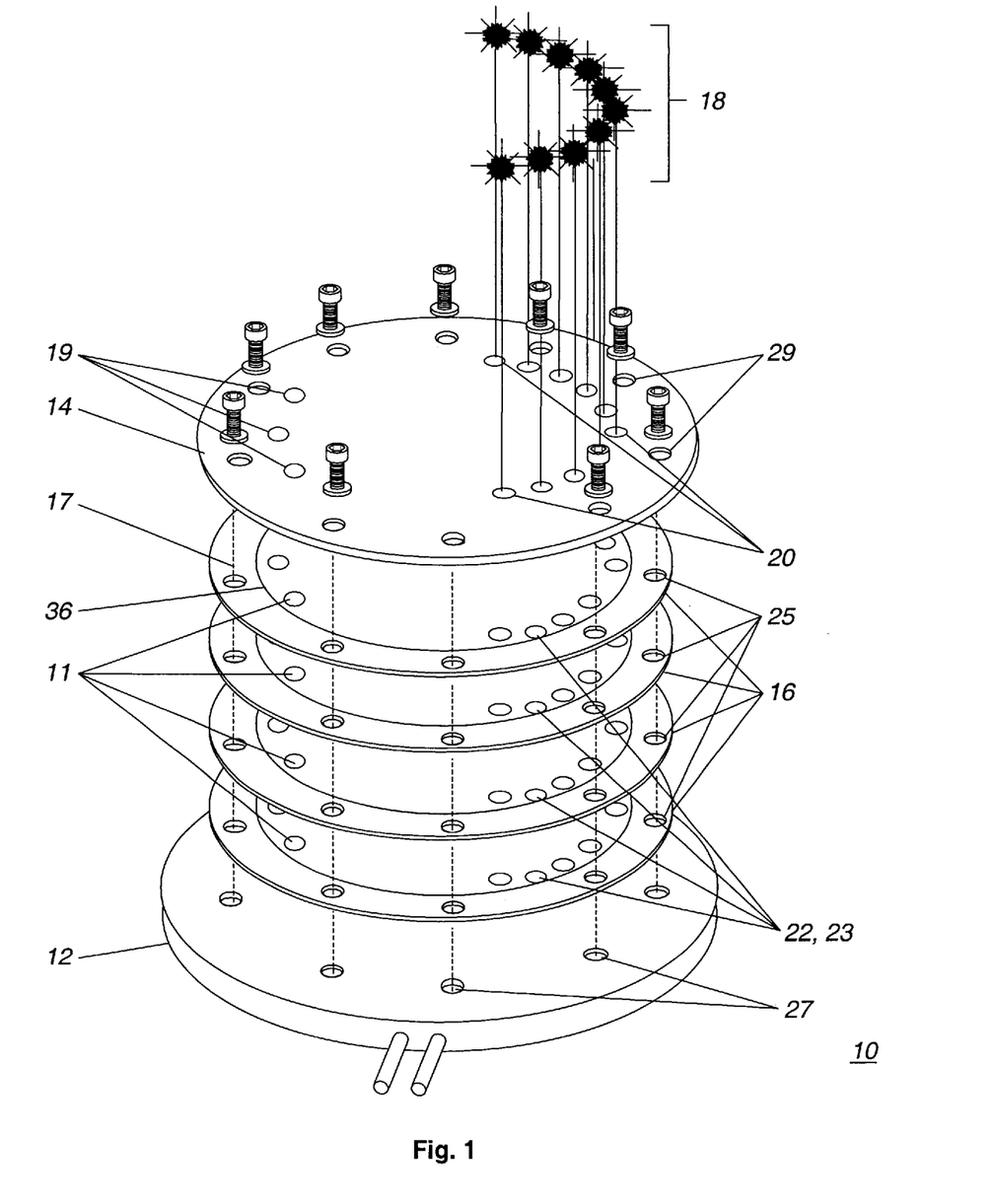
FIG. 1 is an exploded view of a wafer-scale module in accordance with the present invention.

Referring to FIG. 1, an exploded view of a pseudomonolithic wafer-scale module 10 is illustrated. The module 10 includes a top plate 14, a base plate 12, a plurality of stacked integrated circuit wafers 16 sandwiched between the base plate 12 and the top plate 14, and a plurality of integrated optical data buses or waveguides 18 that extend through holes 20 in the top plate 14 and through optical transmission interfaces 23 located on each of the stacked integrated circuit wafer devices 16 at nodes 22.

The top plate 14 provides mechanical support for the module 10 and, like the base plate 12, should have a close coefficient of thermal expansion (CTE) match to the wafer devices 16. The top plate 14 may be formed from low CTE materials such as metal matrix with graphite and carbon composite, aluminum silicon carbide, and aluminum nitride. To provide power to the module 10, the top plate 14 may also include multi-voltage access interfaces 19 that extend from the top plate 14 through access interfaces 11 on each of the stacked wafer devices 16 via physical contact or induction transfer.

The base plate 12 also provides mechanical support for the module 10 and serves as a heat sink for the module 10. The base plate 12 preferably has a thickness of approximately 0.2 to 0.4 inches. To prevent mechanical stress to the stacked wafer devices 16 and to the remaining components of the module 10 as a result of temperature fluctuation within the module 10, the base plate 12 (and top plate 14) may be formed from a material having a relatively low coefficient of thermal expansion (CTE) such as metal matrix with graphite and carbon composite, aluminum silicon carbide, and aluminum nitride.

Thermal dissipation is necessary in the module 10 to remove the thermal heat generated by the incorporation of multiple densely packed multi-WSI integrated circuit devices 16 into a compact area. Through the use of capillary pump loop technology, the base plate 12 provides thermal dissipation for the module 10. A conventional capillary pumped loop is a two-phase heat transfer system. Heat is absorbed by evaporation of a refrigerant at an evaporator section and transported via a vapor in tubing to a condenser section to be removed by condensation at the condenser. This process makes use of a refrigerant's latent heat of vaporization/condensation, which permits the transfer of relatively large quantities of heat with small amounts of fluid and negligible temperature drops. A variety of refrigerants including ammonia, water and various freons have been found to be suitable working fluids.

Figure 2:
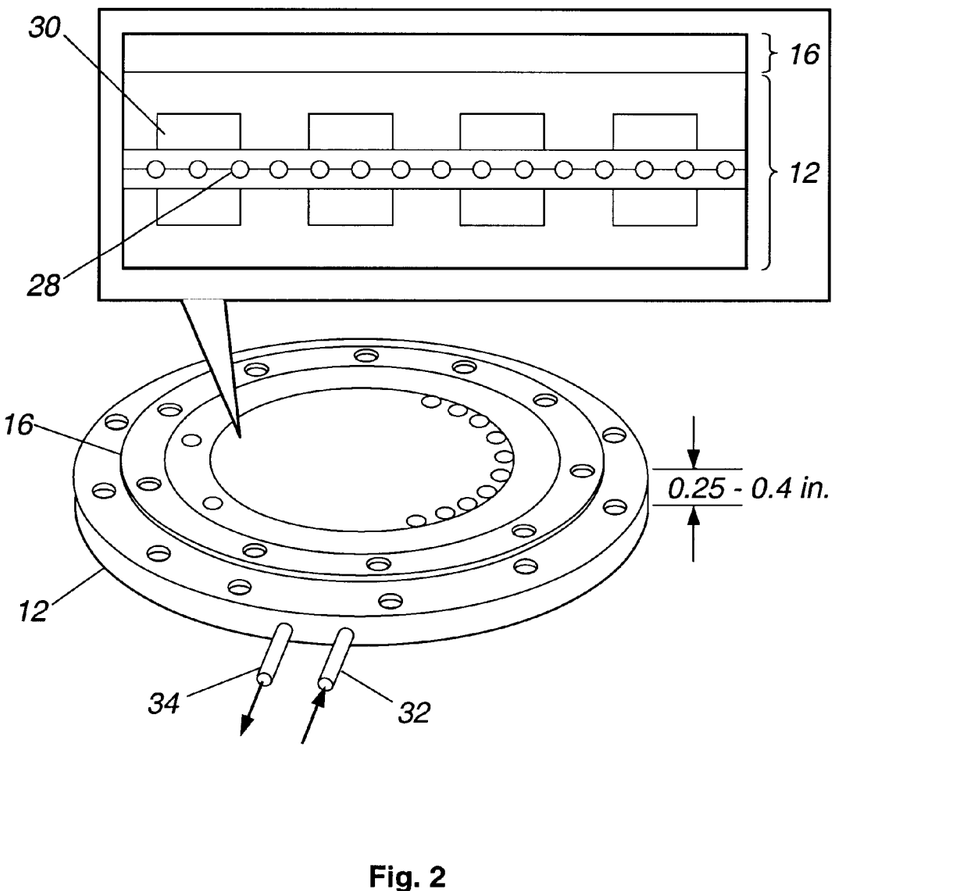
FIG. 2 is a cross sectional view of a base plate including a capillary pumped loop in accordance with the present invention.

Referring to FIG. 2, the most basic capillary pumped loop consists of an evaporator section 30 having a capillary wick structure 28; a condenser section (not shown) that is located away from the element being cooled so as to release the transferred heat into a radiator or other suitable environment that can accept the heat; and a pair of tubes (32, 34), one for liquid (refrigerant) supply to the loop from the condenser section, and the other for vapor return from the loop to the condenser section. In many applications the pressure head generated by the capillary wick structure 28 provides sufficient force to circulate the refrigerant throughout the loop. In other applications, the pressure differential due to fluid frictional losses, static height differentials, or other forces may be too great to allow for proper heat transfer. In these situations it may be desirable to include a mechanical pump (not shown) to assist in movement. It is important to note that a particular capillary pump loop technology is not required to practice the present invention. It is preferable, however, that the base plate 12 have the capacity to reject heat from the module 10 at approximately 1 kilowatt (KW) per wafer or 7200 Watts/ft$^2$.

Figure 3:
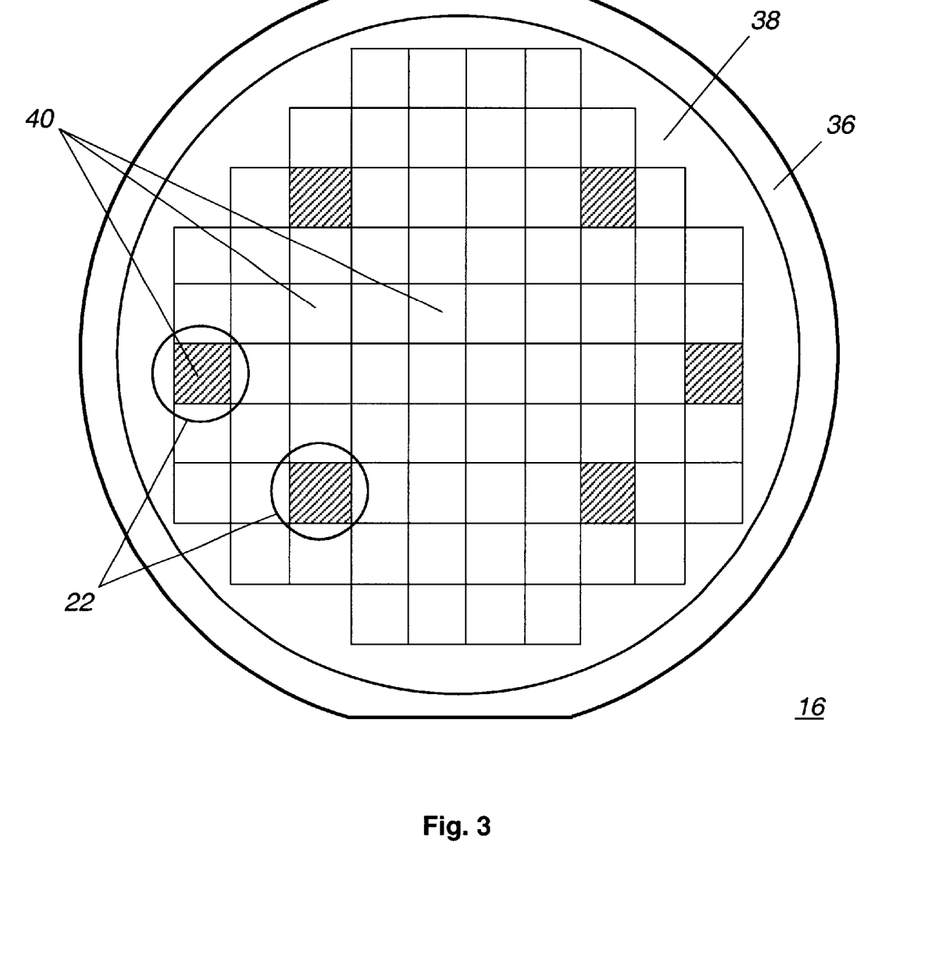
FIG. 3 is a plane view illustration of an integrated circuit wafer device in accordance with the present invention.

Referring to FIG. 3, the plurality of integrated circuit wafer devices 16 each include a wafer 36 and a semiconductor layer 38 formed thereon. The wafer 36 may be formed from a material having relatively high thermal conductivity properties, such as diamond or sapphire. The semiconductor layer 38 is generally planar, and composed of silicon, germanium, gallium arsenide, indium phosphide, gallium phosphide, indium arsenide, or a similar material. The semiconductor layer 38 has a thickness of from approximately 10 microns to 50 microns, and includes thousands of integrated circuits 40 or components formed by monolithic wafer-scale integration (WSI) techniques. The integrated circuits 40 particularly comprise application specific integrated circuits (ASICs) and also comprise optoelectronic components that provide communication interface nodes 22 for high-speed optical data communication between the integrated circuits 40 and other integrated circuit wafer devices 16. Although fault detection and recovery for the integrated circuits 40 is not necessary to practice the present invention, there are numerous circuit fault detection and recovery schemes that could be employed with this invention to mitigate the effects of wafer defects. Such schemes may include the techniques disclosed by U.S. Pat. Nos. 4,653,050, 5,185,050, 5,216,637 and 5,299,202, all assigned to the assignee of the present invention.

Figure 4:
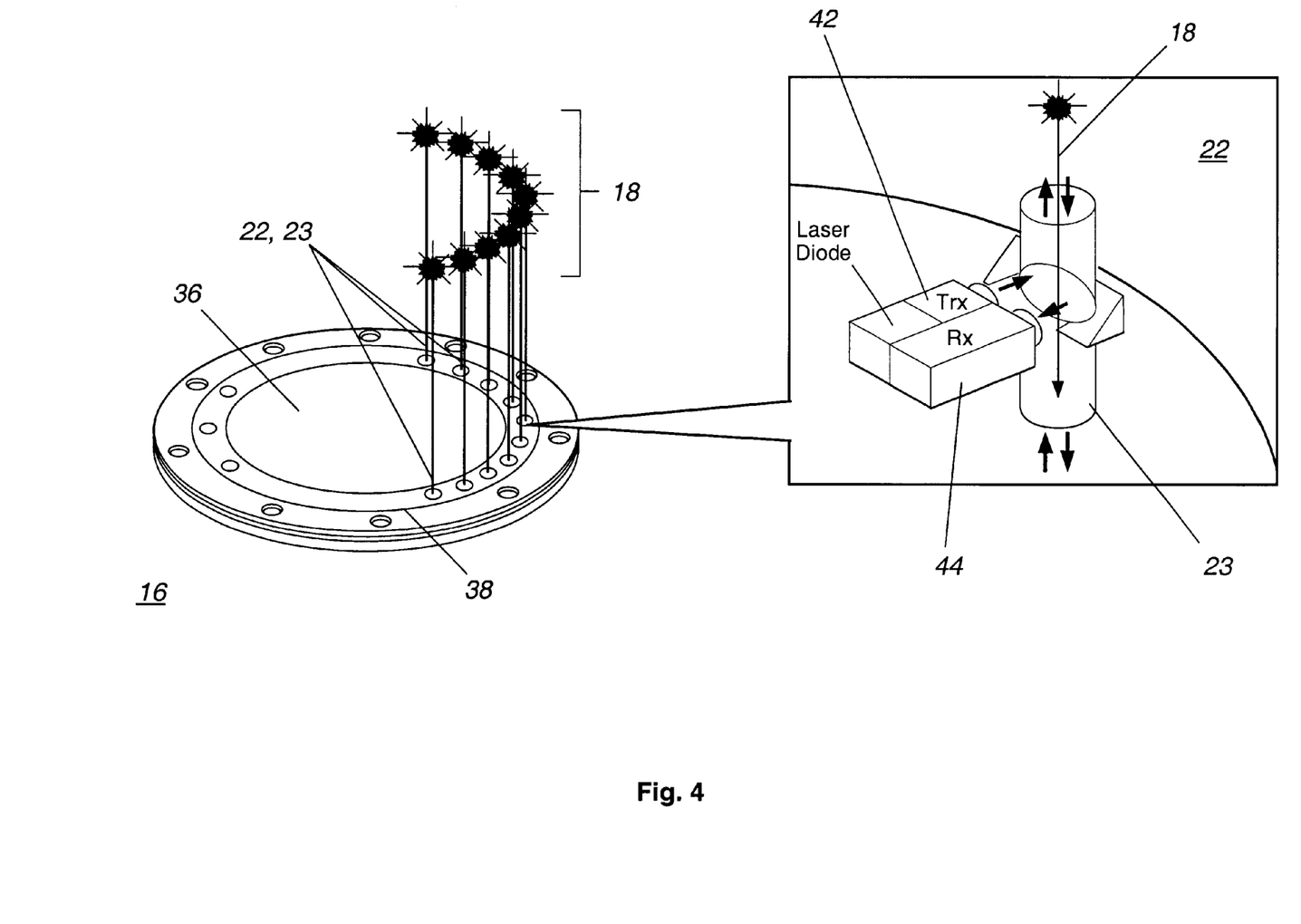
FIG. 4 is a three-dimensional view of the integrated circuit wafer device having multiple device nodes and multiple optical waveguides.

Referring to FIG. 4, to provide optical interconnectivity between the stacked integrated circuit wafer devices 16, each wafer node 22 includes a transmitter circuit 42 and a receiver circuit 44. For purposes of the present invention multiple nodes 22 (transmitter/receiver circuit pair) or a single node 22 may be formed on each wafer 36. A preferred embodiment of the present invention includes the wafer 36 having multiple nodes 22. In this embodiment, multiple optical waveguides or optical data buses 18 (described below) extend at multiple nodes 22 through optical transmission interfaces 23 to facilitate a multi-channel broadcast architecture between one respective wafer device 16 and the other external wafer devices 16. In the single node embodiment, a single optical data bus 18 or waveguide extends at a node 22 through an optical interface 23 to facilitate a single-channel broadcast architecture between each wafer device 16 and all other wafer devices located at various levels in the stack. Alternatively, the nodes 22 can be placed at an edge of each wafer 36, thereby alleviating the need for the optical interfaces 23.

It is important to note that for purposes of the present invention, the external devices referenced by the present invention are preferably, but not necessarily, other wafer-scale integrated circuit devices 16, like those described herein.

Figure 5:
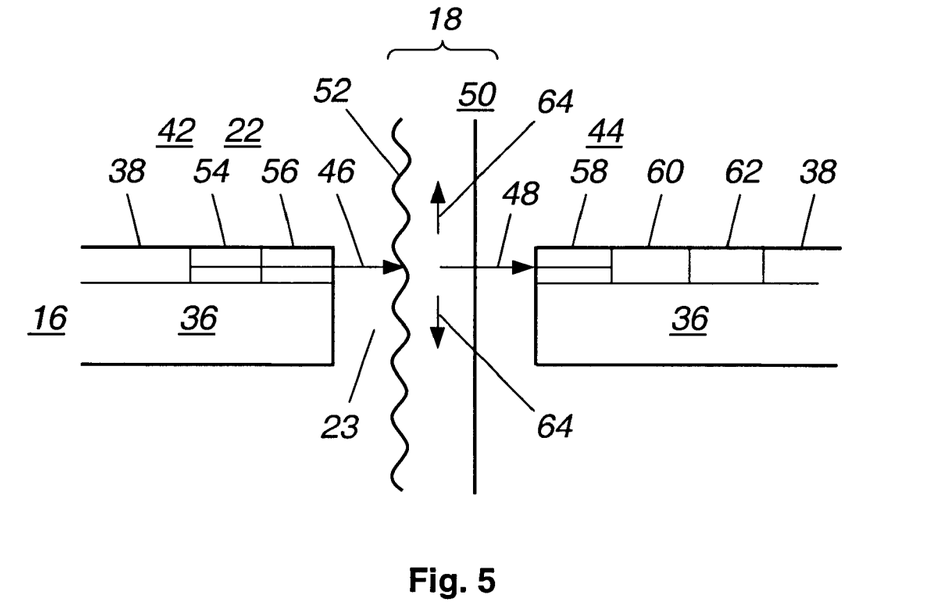
FIG. 5 is a diagrammatic view of the interface between an integrated circuit wafer device node and an optical waveguide in accordance with the present invention.

Referring to FIG. 5, data output from the transmitter circuit 42 normal to the optical data bus 18, shown by numeral 46, is propagated bi-directionally through the data bus 18 and is received by all external wafer devices 16 (not shown) located along the optical data bus 18; and, data propagating through the optical data bus 18 from an external wafer device 16 is coupled out of the optical data bus 18 into free space for detection by the receiver circuit 44, as shown by numeral 48. The optical data bus 18, preferably a vertical integrated optical data bus (VIODB) comprises an optical waveguide 50 having a plurality of gratings 52 (see FIG. 7) such as Bragg gratings, and extends through an optical interface 23 normal to the plane of the wafer 36 and hence to the transmitter and receiver circuits (42, 44) so that a grating coupler 52 of the data bus 18 is located at each transmitter/receiver pair, also referred to as the node 22. The optical data bus 18 does not require physical contact between the optical interfaces 23 and the waveguide 50, allowing for a connectorless interface at each node 22. Additionally, the grating coupler 52 does not require a critical optical alignment to perform the optical coupling of light in and out of the waveguide 50. Each grating 52 serves to Bragg diffract the normally incident light beam 46 and launch it bi-directionally in equal amounts within the waveguide 50. Conversely, when the guided mode of the propagating light beam reaches any grating 52 within the waveguide 50, the recipient gratings 52 Bragg diffract and couple portions of the progagating light out of the waveguide 50 into free space regions, as shown by numeral 48.

The transmitter circuit 42 comprises a light source 54 for emitting a coherent, monochromatic beam of light 46, and an external modulator 56. The light source 54 is preferably incorporated as a hybrid element onto the semiconductor layer 38 at the node 22. Alternatively, the light source 54 may be grown epitaxially on the layer 38 using regrowth of gallium arsenide, indium phosphide or a like semiconductor material on silicon technology, or it may be formed from porous silicon optical emitters. The light source 54 is disposed adjacent to the external modulator 56 and the external modulator 56 is disposed proximate the optical interface 23 in the wafer 36. The location of the light source 54 is such that the light it transmits from its edge propagates in a direction parallel to the surface of the wafer 36 towards the grating 52. The transmitted coherent monochromatic light 46 has a cross section that diverges as it propagates. This divergence leads to a reduced coupling efficiency with the waveguide 50 but allows for greater alignment tolerance.

To illustrate how data is transferred to the optical transmitter 42 from the remaining circuitry 40, transmitter driving circuitry (not shown) is included as part of the integrated circuitry 40 of the wafer 36. This circuitry electrically drives the optical transmitter 42 to deliver light when the input signal is a digital "one" and electrically drives the optical transmitter 42 to deliver no light when the input signal is a digital "zero." This electrical drive can be applied either to the light source 54 or preferably to the external modulator 56 to achieve these optical outputs. The data transferred to the transmitter driving circuitry from the remaining integrated circuitry 40 is comprised of a digital serial data stream of "ones" and "zeros" represented by two distinct voltage states respectively. This data stream is preferably from a single bit in a parallel digital word, in which case there are additional optical data bus nodes 22 for each of the remaining bits in the parallel digital word. Alternatively, the parallel digital words can be electrically transferred into a higher rate serial data stream using a parallel loading digital shift register (not shown). Once the parallel word is loaded into the shift register, the data is shifted over one data bit at a time across the entire register before the next parallel word is loaded, in order to deliver a serial data stream to the transmitter driver circuit for the optical transmitter 42.

Referring still to FIG. 5, the external modulator 56 is preferably an electro absorption laser diode modulator that has a discrete channel spectrum of from 1300 nanometers (nm) to 1600 nanometers (nm) and preferably, though not mandatory, is capable of producing an optical signal having data rates above 10 Gbps. The modulator 56 is integrated into the semiconductor layer 38 and is made from the same semiconductor material as the light source 54. Alternatively, the modulator 56 may be made from any materials that are highly compatible with gallium arsenide, or indium phosphide technology, and which have been used for millimeter wave integrated circuits, for example, indium, gallium, aluminum, arsenide, and phosphide.

The receiver 44 includes at the node 22, a detector 58, an amplifier 60 and signal processing circuitry 62. The detector 58 is positioned proximate to and at the edge of the optical interface 23 facing the grating 52 and the light source 54. The detector 58 detects the emitted optical signals and converts them into an electrical signal that is amplified by the amplifier 60 and later processed by the signal processing circuitry 62. The amplifier 60 and signal processing circuitry 62 are part of the integrated circuitry 40 of the wafer 36. The signal processing circuitry 62 limits the electrical signals delivered by the amplifier 60 to a voltage that represents digital "ones" in the intervals where light is transmitted, and digital "zeros" in the intervals where no light is transmitted. The serial data stream delivered by the signal processing circuitry 62 is preferably used as the data corresponding to a particular data bit in a digital parallel word. In this case, there are additional optical data bus nodes 22 for each of the remaining bits in the parallel digital word. Alternatively, the serial data stream delivered by the processing circuitry 62 can be electrically loaded into a serial input shift register (not shown) and read out as a parallel word after an entire register of serial data has been clocked in from the processing circuitry 62. As will be described later, the light 48 output coupled out from the grating 52 is collimated into a narrow beam constrained to a plane normal to the waveguide 50 by the extended grating aperture.

Referring again to FIG. 5, the optical waveguide 50 is a dielectric slab made from an optically transparent material, such as glass, a polymer material, or an optical semiconductor and supports a characteristic propagating mode or modes. It has an index of refraction $n_2$ and a periodic Bragg surface grating 52. Mask techniques or holographic interference techniques are used to make the periodic Bragg gratings 52 on the surface of the slab. The Bragg surface grating 52 has a period, $\Lambda$, and serves to Bragg diffract and couple the incident light transmitted by the light source 54 and delivered by the external modulator 56 into a propagating mode of the waveguide 50 that conveys the light axially and bi-directionally through the dielectric slab waveguide 50 as illustrated by the arrows numbered 64. This light 64 is launched equally in both directions. At each grating 52 a portion of the light 64 flowing axially through the slab is Bragg diffracted and coupled out of the waveguide 50 in a direction normal thereto (shown by numeral 48) and hence through the surrounding air and into the detector 58. Since the light 64 propagates in both directions all device detectors 58 receive some of the propagating incident light flowing through the waveguide 50. In this way, detectors 58 in all the other external wafer devices 16 receive the data contained in the optical signal transmitted by the transmitter 42 at the node 22. The grating 52 allows for coupling from both sides of the waveguide 50, enabling the transmitter 42 to be positioned on one side of the optical interface 23 and the receivers 44 to be positioned on the opposite side of the node 22.

Figure 6:
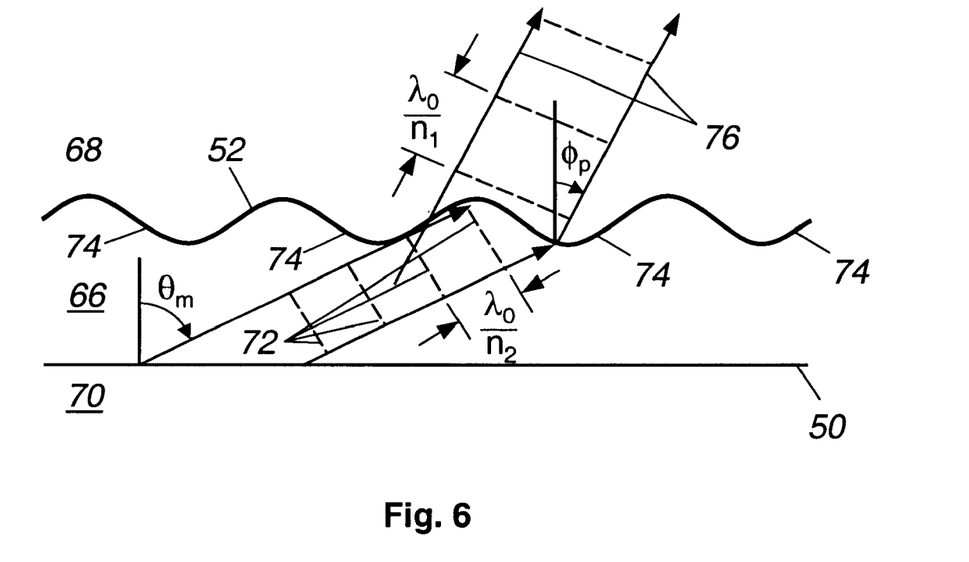
FIG. 6 is a diagrammatic view illustrating light coupling out of an optical waveguide grating coupler.

Referring to FIG. 6, the dielectric slab waveguide 50 comprises three adjacent layers of optically transparent material with refractive index $n_2$ of the middle core layer 66 being greater than the refractive indices $n_1$ and $n_3$ of the two outer cladding layers, 68 and 70 respectively.

The guided propagating modes will depend on the wavelength of light, $\lambda_0$, the indexes of refraction of each layer, $n_1$, $n_2$, and $n_3$, and the thickness d of the core layer 66 which corresponds to the distance between the upper layer 68 and the lower layer 70. Because the propagating mode in the dielectric waveguide has evanescent electric field tails that extend from the core into the cladding, the periodic grating 52 at the interface between the core 66 and the cladding Bragg diffracts the propagating light out of the waveguide 50.

The rays of the propagating mode of light approach the grating at the allowed angles for propagation denoted by $\theta_m$. This angle of approach establishes a wavefront 72, denoted in FIG. 6 by the wavefront spacing given by $\lambda_0/n_2$, that is scattered from the periodic grooves 74 of the grating 52. Each groove 74 in the grating 52 scatters light in all directions out of the waveguide 50. When adjacent grooves are driven by light that has a fixed phase lag set by the propagation angle of incidence, the scatter direction of adjacent grooves is constructive and adds up in phase for one particular output coupling angle, $\phi_p$, as shown by arrows 76. At this output coupling angle, $\phi_p$, the light is launched out of the waveguide 50 to propagate in free space with a wavefront spacing noted in FIG. 6 as $\lambda_0/n_1$.

The relation for this grating output coupled light is given in terms of the angle of the propagating mode, $\theta_m$, the wavelength of light, $\lambda_0$, the period of the grating, $\Lambda$, and the refractive indexes $n_1$ and $n_2$ of the two layers (68, 66) respectively that form the grating interface as, $$n_2 \sin \theta_m + n_1 \sin \phi_p = p\lambda_0/\Lambda \tag{1}$$

where p is the output coupled order. It is important to note that the grating coupling expression given by the equation (1) does not include refractive index $n_3$, because the light never propagates in the bottom layer 70.

The above description has been described for the case of the grating output coupler. Since light has a reciprocity property, the above description and equation also describe the conditions for input coupling light from free space into a propagating mode of the waveguide. Thus, the same grating period is used for both output coupling and input coupling.

In accordance with the present invention, a special condition exists when the grating output coupling angle, $\phi_p$, is zero degrees or at an angle perpendicular to the waveguide. For this case, equation (1) becomes, $$n_2 \sin \theta_m = \lambda_0/\Lambda \tag{2}$$

This expression is the second order Bragg condition for a propagating mode of light to become reflected back on itself within the waveguide 50. So at this normal angle of grating output coupling, the light inside the waveguide 50 happens to also scatter constructively into a mode that is guided by the waveguide 50 and propagates in the opposite direction of the original propagating light. In the case of input coupling, the light is simultaneously launched into the waveguide in both propagating directions (see numeral 64 in FIG. 5). This enables simultaneous broadcast to all the nodes 22 located on the optical data bus 18.

The scattering effect described above pertains to grating coupling light via a Bragg interaction with the corrugated periodic set of surface grooves 74 shown in FIG. 6. The same effect occurs from a periodic variation of the refractive index in the core region of the dielectric waveguide, such as in a volume Bragg grating formed in an optical fiber. In this case, intense light at short ultra violet wavelengths is used to chemically change the glass inside the core of the optical fiber and result in a refractive index change. By making this change occur in a periodic way through the well-known use of optical interference and holographic techniques, a volume grating is made inside the core of the optical fiber. This volume grating produces the same effect on the light propagating inside the core as the surface grating. Thus, volume Bragg gratings formed in optical fiber can be used for the dielectrical optical waveguide with the grating couplers in this invention.

Equation (2) is valid for light that impinges at exactly normal incidence, that is when $\phi_p=0$ in equation (1). This condition is easily met by a fraction of the light transmitted by a laser diode when the plane of the emitting junction of the laser diode is oriented perpendicular to the propagation direction of the dielectric waveguide. Since the aspect dimension of the emitting junction of the laser diode is small in a direction perpendicular to the plane of the junction, the emitted light diffracts over an angular spread of typically 30 degrees in a direction perpendicular to the junction plane. By orienting the dielectric waveguide with its length along this angular spread, a portion of the incident light is always oriented at exactly normal incidence and thus can grating couple into the dielectric waveguide in both directions. The angular spread of 30 degrees delivered by the optical source greatly reduces the alignment tolerance required of the optical sources. It is this additional freedom of optical alignment that can allow the waveguide 50 to be removed for purposes of replacing a wafer having an onboard defect, as described in detail in the cross referenced application, entitled "Large Multi-Function Integrated Circuit Device" by Coronel et al.

The light emitted from the external modulator 56 will also diffract over an angular spread of typically 30 degrees in a direction perpendicular to the junction plane. This is because the aspect dimension of the emitting junction of the external modulator 56 is small in a direction perpendicular to the plane of the junction. Since the junction plane is grown parallel to the plane of the wafer 36, the emitted light from the modulator 56 will also be spread along the length of the dielectric waveguide just as was the case for a laser source. Thus, there will be a reduced alignment tolerance of the external modulators also.

In a similar way, the light that is output coupled from the grating coupler experiences a similar diffraction that again reduces alignment tolerance of the detector 58. The light is emitted, according to equation (2), at an angle that is exactly normal to the dielectric waveguide surface, i.e. when $\phi_p=0$ in equation (1). This means that the detector must be positioned in a plane that is exactly normal to the dielectric waveguide. However, due to the narrow extend of the grating coupler in a direction parallel to the normal plane, there will be diffraction of the output coupled light causing an angular spread within the normal plane. This angular spread reduces the placement tolerance required of the photodetector within the plane. In addition, the fact that the output coupled light has a narrow angular spread in a direction that is perpendicular to the normal plane helps to direct the light to where the photodetector is positioned, thus increasing detection efficiency.

The dielectric slab waveguide 50 previously described and illustrated in FIG. 6 may alternatively comprise a thin sliver of dielectric material that enables guided mode propagation. In this configuration, the surrounding air, having a lower refractive index than the thin sliver of dielectric material, provides for total internal reflection of the propagating mode and serves as the outer layer of the waveguide. The use of air interfaces as part of the waveguide greatly simplifies the manufacture of the dielectric waveguide with its grating coupler.

The dielectric slab waveguide 50 illustrated in FIG. 6 may also be comprised of an indium gallium arsenide phosphide (InGaAsP) semiconductor material that is transparent to a wavelength of 1.32 $\mu$m. This is a commonly used wavelength delivered by semiconductor lasers made of the same material. Here, $n_1=1.0$, $n_2=3.35$ and $n_3=3.2$, where the composition of the layers of the InGaAsP semiconductor have been appropriately adjusted to achieve these refractive indexes. The core layer thickness is d=0.8 $\mu$m which sets up a propagating mode with a ray tracing or propagation angle $\theta_m$ of 79.6 degrees. By using a grating period of 0.4005 $\mu$m a grating coupler is formed that will deliver light normal to the waveguide surface or couple light incident normally to the surface in both directions in the waveguide.

Additionally, the optical waveguide 50 may comprise an optical fiber (single mode SMF-28 fiber) dielectric waveguide in which the refractive indexes of a glass optical fiber are $n_1=1.4595$, $n_2=1.461$ and $n_3=1.4595$. The core diameter of the single mode SMF-28 fiber is d=9.0 $\mu$m. The wavelength is 1.55 $\mu$m, which is becoming very common in the telecommunication field because an optical fiber has lower loss at this wavelength than at 1.32 $\mu$m. These parameters result in a guided mode propagation angle, $\theta_m=88.23$ degrees. By using a volume grating with a period of 1.06 $\mu$m, the propagating light can be coupled in or out normally to the fiber.

Figure 7:
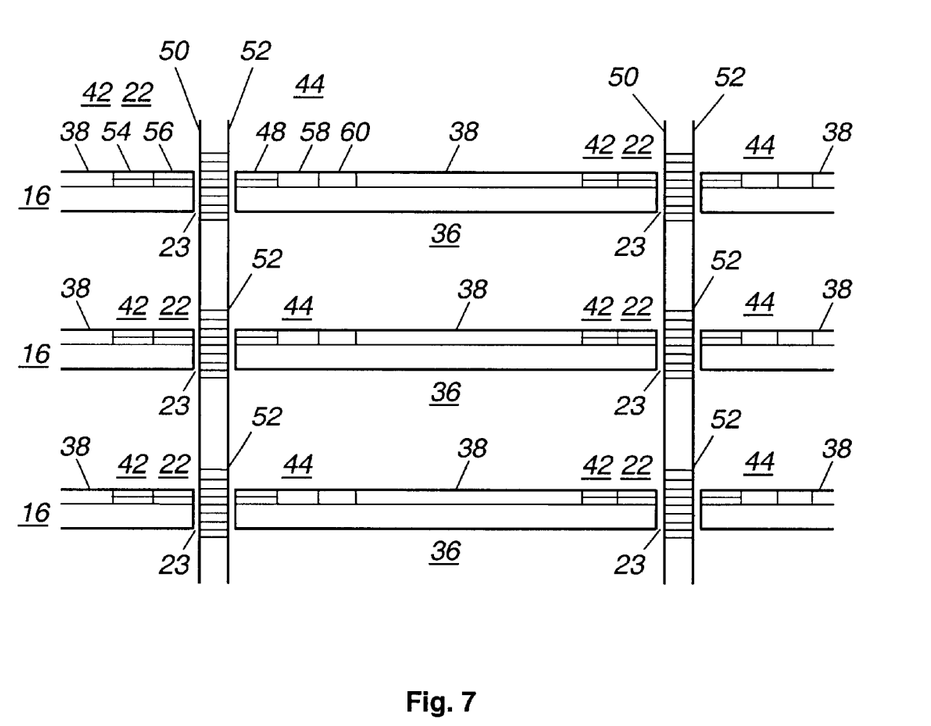
FIG. 7 is a diagrammatic view of the interfaces between multiple stacked wafer integrated circuit devices and multiple optical waveguides in accordance with an embodiment of the present invention.

Operationally, as shown in FIG. 7, the optical transmitters 42 transmit optical signals in the form of modulated light beams 46 in the plane of the stacked wafers 36. The transmitted beams 46 thus are normally incident on the Bragg gratings 52 on the side of the dielectric waveguides 50. The waveguides 50 are oriented perpendicular to each of the stacked wafers 36. Each grating 52 couples the normally incident transmitted light 46 bi-directionally into a propagating mode of its associated waveguide 50, which in turn sends the light 64 toward the nodes 22 in the other stacked circuit wafer devices 16. A portion of the propagating light 64 is coupled out of the waveguide 50, by each grating 52, as shown by numeral 48 in FIG. 5, in a direction normal to the waveguide 50 toward the respective optical detector 58. Thus, light 64 from a transmitted optical signal is transferred to the detectors 58 on the other wafers 36. In other words, only a fraction of the light 64 is coupled out by each grating 52 so that light remains in the waveguide 50 to propagate toward the next transmitter/receiver pair at the node 22 of a downstream wafer 36 in the stack. In this way, the data transmitted by a transmitter/receiver pair at a node 22 on one wafer 36, is received by the nodes 22 on all other wafers 36. Since the grating coupler 52 is designed to couple normal incident light, the light is launched in both directions axially through the waveguide 50 ensuring that the device wafers both above and below the wafer 36 on which the light source 54 is located receive the data.

For purposes of recovering from defective circuit wafer devices 16 that may exist in the stack, the optical data bus 18, does not require physical contact between the optical transmission interfaces 23 and the waveguide 50, thereby allowing a connectorless interface at each node 22. Also as previously described, a grating coupler 52 that does not require critical optical alignment performs the optical coupling of light into and out of the waveguide 50. The absence of physical contact between the optical interfaces 23 and the waveguide 50, in conjunction with the liberal tolerance allowed at each node 22, enables the optical waveguide 50 to be easily removed from the stack of wafer devices 16, and later replaced should a wafer be found defective.

Figure 8A:
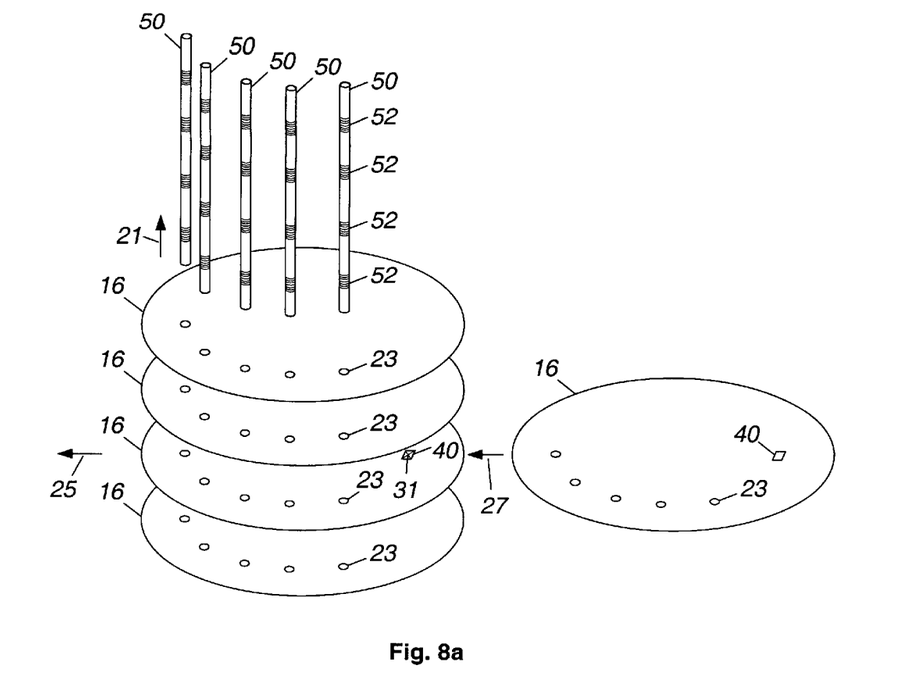
FIG. 8a is a three-dimensional view of the removal of the waveguides from a stack of wafers to allow the replacement of a wafer with a wafer defect.

Referring to FIG. 8a, the waveguides 50 can be removed from the stack of wafer devices 16 with a common vertical motion shown by numeral 21. A temporary removal of the optical waveguides 50 allows a wafer having an onboard circuit defect 31 to be removed from the stack with a motion shown by numeral 25 and replaced with a new wafer using a motion shown by numeral 27.

Figure 8B:
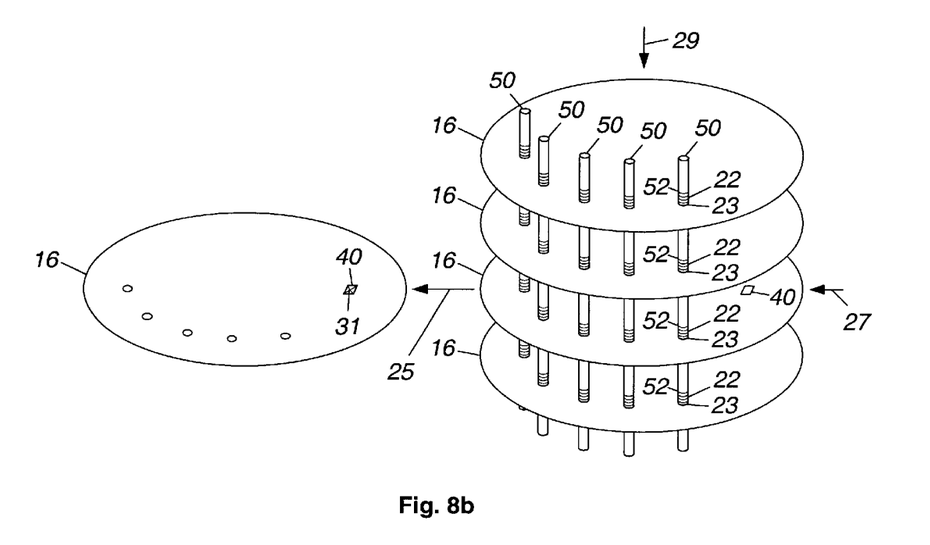
FIG. 8b is a three-dimensional view of the replacement of the waveguides after installation of a new wafer that replaces a defective wafer

Referring to FIG. 8b, the optical waveguides 50 are then returned into position using a vertical motion 29, whereby the nodes 22 retain the connectivity that existed prior to removal of the defective wafer. Connectivity is retained because optical alignment of each of the waveguides 50 is not critical by virtue of the grating coupler 52. And as a result, by repeating this process for every wafer in which a defect is detected, a highly complex integrated module, such as in avionics for a spacecraft, can be assembled defect free.

Figure 9:
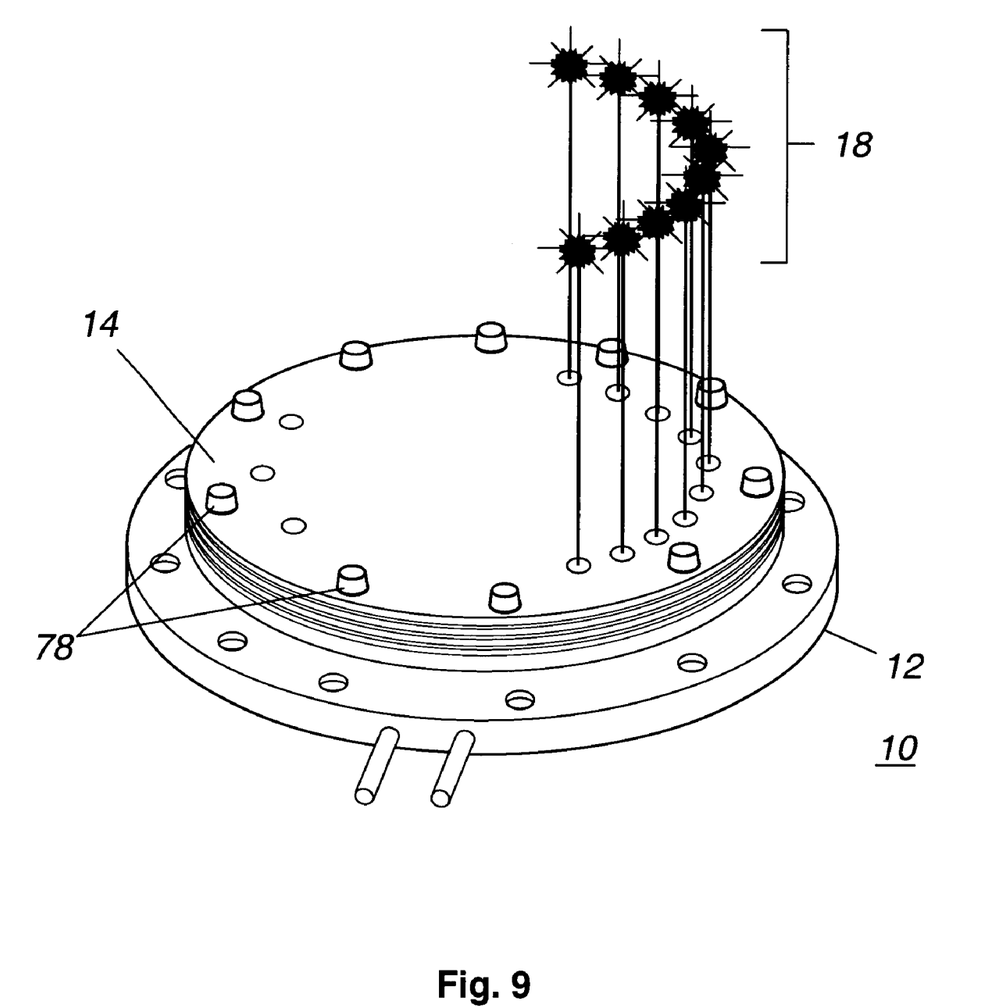
FIG. 9 is a three-dimensional view of the wafer-scale module of FIG. 1 assembled in accordance with the present invention.

Referring to FIG. 9, the module 10 is assembled by fastening the base plate 12, the plurality of integrated circuit wafer devices 16 and the top plate 14 together using a plurality of pins 78, or similar fastening means. The pins 78 are disposed within channels 17 created by aligning a plurality of holes 25 (see FIG. 1) arranged circumferentially and bored through each circuit wafer device 16 with similar circumferentially arranged holes (numerals 27 and 29 of FIG. 1) in the base plate 12 and the top plate 14 respectively. Each pin 78 is held in place using a nut (not shown) or similar securing means. As described above, the waveguides extend through holes 20 in the top plate 14 and optical interfaces 23 of the wafer devices 16. The waveguides may be secured in the module 10 using a non-out gassing adhesive attachment to the top plate 14.

It will be appreciated from the foregoing illustrations that the present invention contributes to a significant advance in large-scale semiconductor device fabrication. The processing functions of large-scale systems can be distributed among multiple integrated circuit wafer devices and data transferred at multi-gigabit rates between all of the wafer devices such that the result is physically equivalent to all of a particular system's circuitry being monolithically integrated on one very large wafer.

Figure 10:
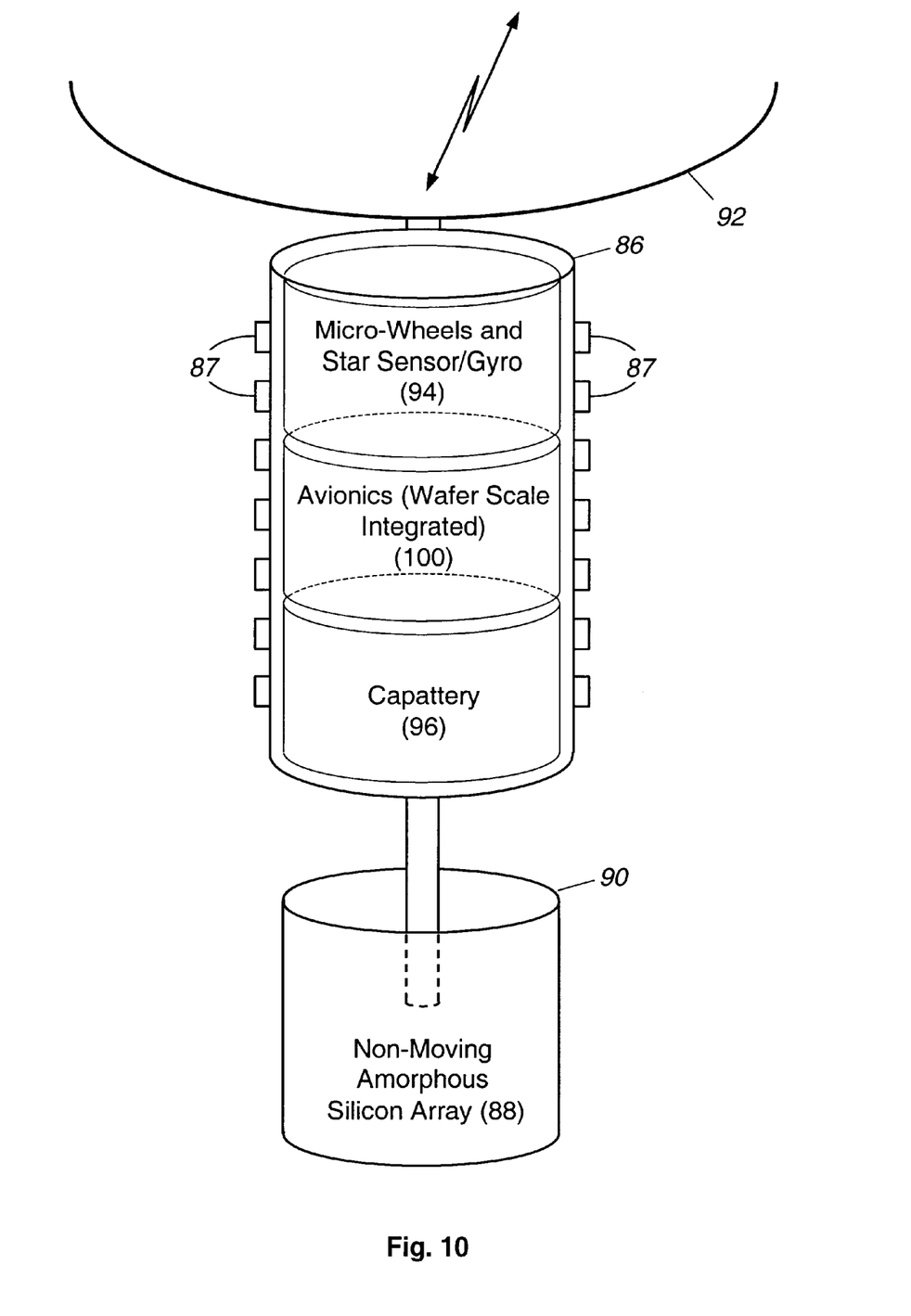
FIG. 10 is a diagrammatic view of a spacecraft including a wafer-scale module as taught by the present invention.

Referring now to FIG. 10, it will also be appreciated from the foregoing illustrations that the present invention contributes to a significant advance in design for economy in manufacture and for compactness of large-scale systems. For example, FIG. 10 shows an avionics system in which a spacecraft takes the form of a cylinder 86 about the size of a coffee can. Disposed on the outside of the cylinder 86 are multiple waffle propulsion panels 87. Extending from the end of cylinder 86 is a non-moving amorphous silicon array 88 mounted on another cylinder 90 of about the same size as the main cylinder 86. At the other end of the cylinder 86 is a deployable antenna reflector 92 or alternatively a phased array antenna. Inside the cylinder 86 are an attitude control subsystem 94 employing micro-wheels and a conventional star sensor and gyro, a capattery 96 for energy storage and a wafer-scale avionics module 100—as taught by the present invention—that provides all of the processing functions for the spacecraft.

Obviously, many modifications and variations of the present invention are possible in light of the above teachings. Thus, it is to be understood that, within the scope of the appended claims, the invention may be practiced otherwise than as specifically described above.

What is claimed is:

1. A wafer-scale module comprising:
    a plurality of wafers adjacently stacked, each wafer having a semiconductor layer formed thereon, with a plurality of through holes arranged circumferentially thereon and extending normal to a plane thereof, each wafer further having a plurality of optical transmission interfaces extending normal to said wafer plane and a plurality of integrated circuits formed on said semiconductor layer, said plurality of integrated circuits including a plurality of nodes, each said node being coplanar with said wafer and proximate to one of said optical transmission interfaces, said node having means for transmitting and receiving optical data to and from said plurality of integrated circuits;
    a plurality of optical waveguides each extending axially through one of said optical transmission interfaces normal to said corresponding wafer node;
    a top plate disposed on said plurality of stacked wafers, said top plate having a plurality of through holes arranged circumferentially thereon and extending normal to a plane thereof, each said top plate through hole being aligned with one said wafer through hole;
    a base plate disposed opposite said top plate such that said plurality of stacked wafers are sandwiched between said top plate and said base plate, said base plate including means for thermal dissipation and a plurality of through holes arranged circumferentially thereon and extending normal to a plane thereof, each said base plate through hole being aligned with one said top plate through hole and one said wafer through hole; and
    means for fastening said top plate to said stacked wafers and said base plate.

2. A wafer-scale module as recited in claim 1, wherein said wafer is formed of a thermally conductive material.

3. A wafer-scale module as recited in claim 1, wherein said wafer is formed of a material selected from the group consisting of diamond and sapphire.

4. A wafer-scale module as recited in claim 1, wherein said semiconductor layer is formed of a material selected from the group consisting of silicon (Si), germanium (Ge), gallium arsenide (GaAs), gallium phosphide (GaP), indium phosphide (InP), and indium arsenide (InAs).

5. A wafer-scale module as recited in claim 1, wherein each said integrated circuit is an application specific integrated circuit (ASIC).

6. A wafer-scale module as recited in claim 1, wherein each of said nodes comprises:
    a transmitter having a light source for emitting a beam of optical data and an external modulator, wherein said light source is disposed adjacent to said external modulator and said external modulator is disposed proximate to said corresponding optical transmission interface such that said beam of optical data transmits from said external modulator and propagates in a direction parallel to said wafer plane and normal to said optical waveguide; and
    a receiver having a detector, an amplifier and signal processing circuitry, said detector disposed adjacent said optical transmission interface facing said light source and said optical waveguide, wherein said detector detects an optical signal emitted from said optical waveguide in a direction normal thereto, and converts said signal to an electrical signal that is amplified by said amplifier.

7. A wafer-scale module as recited in claim 6, wherein said light source is a hybrid element integrated onto said semiconductor layer.

8. A wafer-scale module as recited in claim 6, wherein said light source is re-growth semiconductor material on silicon.

9. A wafer-scale module as recited in claim 8, wherein said re-growth semiconductor material is selected from the group consisting of gallium arsenide (GaAs), gallium phosphide (GaP), indium phosphide (InP), and indium arsenide (InAs).

10. A wafer-scale module as recited in claim 6, wherein said light source is a porous silicon optical emitter.

11. A wafer-scale module as recited in claim 6, wherein said light beam is a coherent monochromatic beam of light.

12. A wafer-scale module as recited in claim 6, wherein said external modulator is an electro absorption modulator.

13. A wafer-scale module as recited in claim 6, wherein said external modulator is a semiconductor laser diode modulator.

14. A wafer-scale module as recited in claim 13, wherein said semiconductor laser diode modulator has a discrete channel spectrum of from 1300 nanometers (nm) to 1600 nanometers (nm).

15. A wafer-scale module as recited in claim 6, wherein said external modulator is integral with said semiconductor layer.

16. A wafer-scale module as recited in claim 6, wherein said external modulator material is a semiconductor material.

17. A wafer-scale module as recited in claim 6, wherein said external modulator is formed of a material selected from the group consisting of gallium arsenide (GaAs), gallium phosphide (GaP), indium phosphide (InP), and indium arsenide (InAs).

18. A wafer-scale module as recited in claim 6, wherein said external modulator is formed of a millimeter wave integrated circuit material selected from the group consisting of indium, gallium, aluminum, arsenide and phosphide.

19. A wafer-scale module as recited in claim 18, wherein said millimeter wave integrated circuit material is compatible with a semiconductor material selected from the group consisting of gallium arsenide (GaAs), gallium phosphide (GaP), indium phosphide (InP), and indium arsenide (InAs).

20. A wafer-scale module as recited in claim 1, wherein said optical waveguide is a dielelectric slab.

21. A wafer-scale module as recited in claim 20, wherein said dielectric slab is formed of an optically transparent material.

22. A wafer-scale module as recited in claim 20, wherein said dielectric slab is formed of a material selected from the group consisting of glass, polymer and optical semiconductor material.

23. A wafer-scale module as recited in claim 1, wherein said optical waveguide is a thin sliver of dielectric material.

24. A wafer-scale module as recited in claim 1, wherein said optical waveguide is formed of an optically transparent semiconductor material.

25. A wafer-scale module as recited in claim 1, wherein said optical waveguide is an optical fiber.

26. A wafer-scale module as recited in claim 1, wherein said optical waveguide is a single mode optical fiber.

27. A wafer-scale module as recited in claim 1, wherein said optical waveguide is an optical fiber dielectric waveguide.

28. A wafer-scale module as recited in claim 1, wherein said top plate is formed of a material having a low-coefficient of thermal expansion.

29. A wafer-scale module as recited in claim 1, wherein said top plate is formed of a material selected from the group consisting of metal matrix with graphite and carbon composite, aluminum silicon carbide and aluminum nitride.

30. A wafer-scale module as recited in claim 1, wherein said thermal dissipation means comprises a capillary pumped loop.

31. A wafer-scale module as recited in claim 1, wherein said base plate is formed of a low-coefficient of thermal expansion material.

32. A wafer-scale module as recited in claim 1, wherein said base plate material is selected from the group consisting of metal matrix with graphite and carbon composite, aluminum silicon carbide and aluminum nitride.

* * * * *